United States Patent [19]
Gore

[11] Patent Number: 5,872,500
[45] Date of Patent: Feb. 16, 1999

[54] SUPERCONDUCTING MRI ELECTROMAGNET

[75] Inventor: Russell Peter Gore, Abingdon, United Kingdom

[73] Assignee: Oxford Magnet Technology Limited, Oxon, England

[21] Appl. No.: 626,405

[22] Filed: Apr. 2, 1996

[30] Foreign Application Priority Data

Apr. 7, 1995 [GB] United Kingdom .................. 9507207

[51] Int. Cl.⁶ ..................................................... H01H 5/08
[52] U.S. Cl. ........................................... 335/216; 505/879
[58] Field of Search ..................................... 335/216, 299, 335/300; 324/318, 319, 320; 505/211, 212, 705, 844, 879, 884, 885, 892, 893

[56] References Cited

U.S. PATENT DOCUMENTS

| | | | |
|---|---|---|---|
| 4,758,812 | 7/1988 | Forster et al. | 335/301 |
| 4,896,128 | 1/1990 | Wollan et al. | 335/299 |
| 5,047,741 | 9/1991 | Laskaris | 335/216 |
| 5,111,172 | 5/1992 | Laskaris | 335/216 |
| 5,239,276 | 8/1993 | Roth et al. | 335/216 |
| 5,289,128 | 2/1994 | DeMeester et al. | 324/318 |
| 5,291,169 | 3/1994 | Ige et al. | 335/216 |
| 5,359,310 | 10/1994 | Pissanetzky | 335/301 |
| 5,463,364 | 10/1995 | Muller | 335/299 |

FOREIGN PATENT DOCUMENTS

| | | |
|---|---|---|
| 0 413 571 A1 | 2/1991 | European Pat. Off. . |
| 0 487 352 A2 | 5/1992 | European Pat. Off. . |

*Primary Examiner*—Lincoln Donovan
*Assistant Examiner*—Raymond Barrera
*Attorney, Agent, or Firm*—Evenson, McKeown, Edwards & Lenahan, PLLC

[57] ABSTRACT

A superconducting annular electromagnet for MRI purposes includes an annular winding within which a generally cylindrical space is provided. The winding includes at least one pair of annular coils, each having an outer cylindrical surface which is suitably formed to define a feature which facilitates fixing.

12 Claims, 2 Drawing Sheets

SUPERCONDUCTING MRI ELECTROMAGNET

BACKGROUND OF THE INVENTION

1. Field of the Invention

This invention relates to annular superconducting electro-magnets for use in magnetic resonance imaging (MRI) apparatus.

2. Description of Related Art

Such electro-magnets comprise annular windings which are immersed in liquid helium to produce the low temperatures necessary for superconductivity. Such annular electro-magnets afford a cylindrical space within which a patient is positioned, the space including a predetermined substantially spherical volume, hereinafter referred to as the imaging volume, of high homogeneity magnetic field produced by current in the annular windings.

One of the problems with known electro-magnet arrangements is that in order to provide a desirable degree of magnet field homogeneity and magnetic field strength in the imaging volume, annular electro-magnets having a comparatively long axial length are necessary. One consequence of this is that patients positioned therein tend to suffer from claustrophobia.

SUMMARY OF THE INVENTION

It is an object of the present invention, to provide an electro-magnet in which the axial length is reduced, whereby the provision of MRI apparatus is facilitated wherein the tendency to produce claustrophobia is reduced correspondingly.

It is a further object of the invention to provide an improved fixing for annular windings in superconducting electro-magnets suitable for use in MRI apparatus.

According to the present invention, a superconducting annular electro-magnet for MRI purposes comprises an annular winding within which a generally cylindrical space is provided, the winding comprising at least one pair of annular coils, each having an outer cylindrical surface which is suitably formed to define a feature which facilitates fixing.

The outer cylindrical surface may be formed with a step to facilitate fixing, although any other suitable fixing feature may be used such a tapered region for example.

The annular coils may each be fabricated as formerless units by impregnation of the turns of the coils with a suitable impregnant.

The coils may each be wound on a mandrel and enclosed in a mould in which the feature is formed, and impregnated with the impregnant which is cured before the coil is removed from the mould and mandrel.

An outer annular space between the coil and the mould may be filled with a suitable filler, such as glass beads or glass fibre, prior to impregnation so that the said step is formed in the impregnated filler.

The coil may be clamped to a support structure of a magnet, by means of a plurality of clamps which engage the step.

The clamps may be generally L-shaped and bolted at one end to the support structure and arranged at the other end remote from the support structure to engage the said step.

The clamps may be equi-angularly spaced around the cylindrical surface of the coil in which the step is formed.

The mandrel on which each coil is wound may be shaped so that the coil is formed with a chamfer, to provide flaring at each end of the said space.

By providing flaring at each end of the space wherein the patient is positioned, an impression of reduced axial length of the space is conveyed to the patient, and consequently a feeling of reduced enclosure, which is effective to reduce claustrophobia.

The electro-magnet may comprise a plurality of annular coils, which in combination define an electro-magnet winding, the coils being disposed symmetrically along a common longitudinal axis, which coils include two similar annular end coils positioned one at each end of the said space, which end coils are each formed with the step to facilitate fixing, and the chamfer to facilitate provision of the said flaring.

The winding is in use contained in a vessel filled with liquid helium, the vessel being contained in a vacuum chamber with at least one heat shield positioned in the chamber between the vessel and an outer wall of the chamber.

The magnet may form a part of MRI apparatus which includes gradient coils and RF coils as required for imaging.

BRIEF DESCRIPTION OF THE DRAWINGS

One embodiment of the invention will now be described by way of example only with reference to the accompanying drawings, wherein;

FIG. 1 is a generally schematic sectional side view of MRI apparatus, including an annular superconducting electro-magnet, and wherein.

DESCRIPTION OF THE PREFERRED EMBODIMENT

Figure 1:
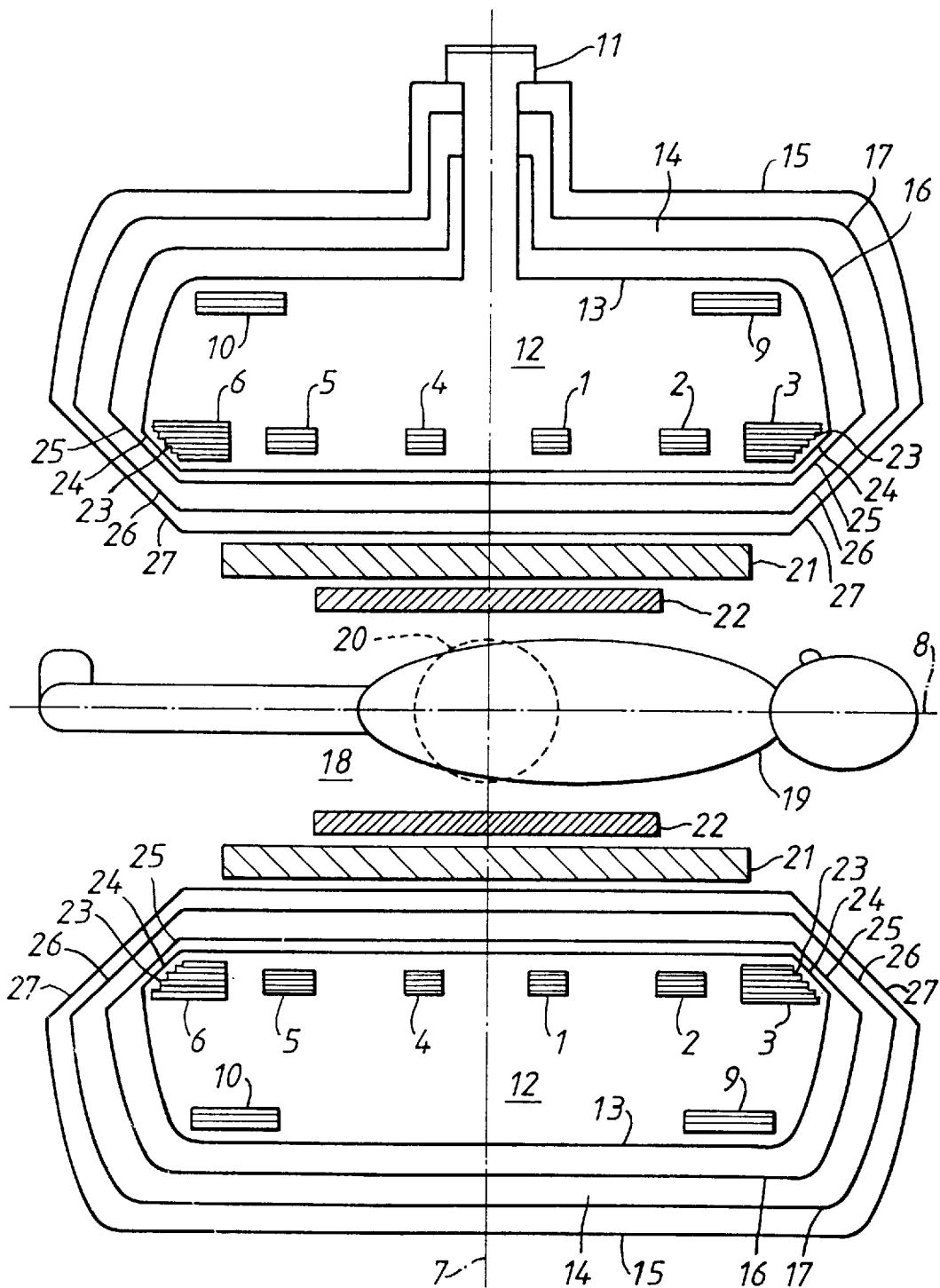

Referring now to FIG. 1, the apparatus comprises an electro-magnet winding defined by coils 1 to 6, which are serially connected to carry a magnetising current. The coils 1 to 6 are symmetrically disposed about a central vertical axis 7 and a longitudinal axis 8 which is common to the coils 1 to 6. In order to provide shielding from the magnetic field produced when the coils 1 to 6 are energised, shielding coils 9 and 10 are provided which are serially connected with the coils 1 to 6 and arranged to produce a field which substantially cancels the magnetic field produced by the coils 1 to 6 outside the assembly. Electrical connection to the coils just before described, is effected in a known manner via a service turret 11, which is arranged to communicate with the interior of a helium vessel 12 having an outer wall 13. The helium vessel 12 is filled with liquid helium via the service turret 11, whereby the coils 1 to 6 and 9, 10 contained therein are maintained at a temperature of about 4° K. necessary to produce superconductivity. In order to reduce heat gain by the liquid helium, the vessel 12 is contained in a vacuum chamber 14 having an outer wall 15. Between the outer wall 15 of the vacuum chamber and the wall 13 of the helium vessel, two heat shields 16 and 17 are provided may be fabricated from aluminium and which serve to reduce heat gain by radiation.

A cylindrical space 18 is provided within the apparatus, within which space 18 a patient 19 is positioned so that a portion of the patient to be examined lies within a spherical imaging volume 20, wherein the magnetic field is highly homogeneous. In order to provide for magnetic resonance imaging, gradient coils 21 and RF coils 22 are provided. Operation of the gradient coils and RF coils is well understood by those skilled in the art and so details of the imaging process, which is not central to the present invention, will not herein be described.

As hereinbefore explained, one of the problems with MRI apparatus is that in order to produce a desirable degree of magnetic field linearity within the imaging volume 20, magnets having a relatively long longitudinal axial length are required which tend to produce claustrophobia in patients, due to the degree of enclosure. In the present arrangement, in order to reduce the possibility of claustrophobia, the coils 3 and 6 which constitute end coils, are shaped to provide chamfers 23 and those portions 24, 25, 26 and 27 of the vessel 13, the shields 16 and 17 and the vacuum chamber outer wall 15 respectively, which are adjacent the chamfer 23, are chamfered correspondingly to provide flaring at each end of the space 18. The provision of this flaring affords to the patient 19 a feeling of reduced enclosure and accordingly provides for a reduced tendency to claustrophobia. Various modifications may be made to the arrangement shown and for example, in alternative arrangements different chamfer angles and shapes may be provided.

In order to fabricate the coils 3 and 6, they may be wound on a suitably shaped mandrel, thereby to form the chamfers 23, and thereafter impregnated with an epoxy resin impregnant which is cured so that it solidifies prior to the coil being removed from the mandrel.

Figure 2:
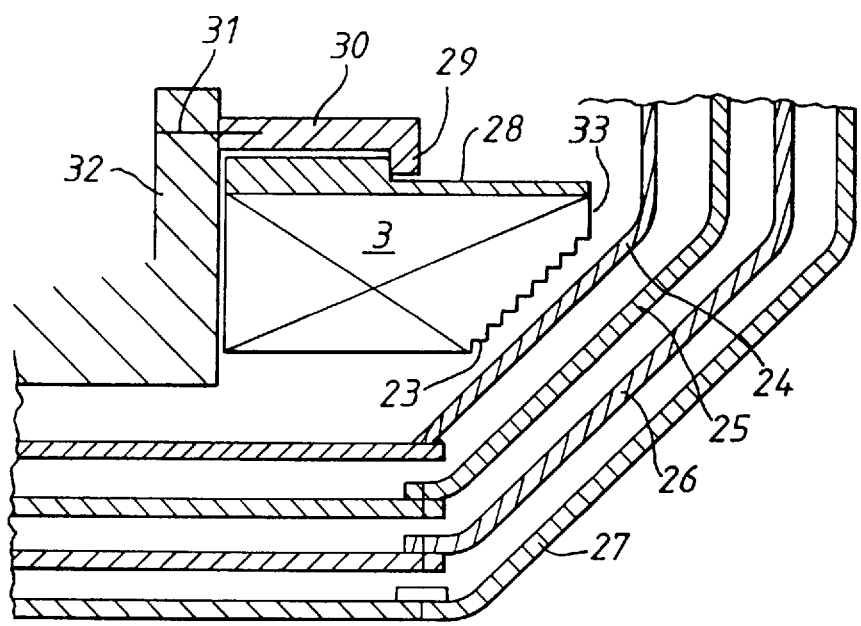
FIG. 2 is a somewhat schematic sectional side view showing in greater detail a part of the apparatus shown in FIG. 1.

As shown in FIG. 2, wherein parts corresponding to FIG. 1 bear the same numerical designations, the coil 3 may be provided with an outer layer 28, of impregnated glass beads or glass fibre, in which a step 29 is formed, which serves to facilitate fixing by means of 'L-shaped' clamps 30 (only one of which is shown), which are held in place by means of screw threaded bolts 31. In order securely to clamp the coils, a single clamp may be used or several clamps may be used, as in this embodiment, spaced equi-angularly around the outer cylindrical surface of the coil and engaging the step. The bolts 31 are arranged to pass through an aluminium support structure 32 on which the coils 1 to 6 and 9, 10 are mounted. By providing this kind of fixing, the need for a clamp which embraces an end portion 33 of the coil 3 so as to extend its axial length, is obviated. This is particularly advantageous because it facilitates a reduction in the overall axial magnet length which in turn facilitates the provision of apparatus wherein the tendency to produce claustrophobia in patients is reduced.

I claim:

1. A short superconducting annular MRI electro-magnet comprising:

a cylindrical bore containing, at its center, an imaging volume, an annular winding comprising a plurality of coils, each coil being placed around and coaxial with the cylindrical bore, the plurality of coils comprising at least first and second formerless impregnated annular coils, a support structure, at each end of said electro-magnet, to which said first and second formerless impregnated annular coils are directly mounted, each of said first and second annular coils having an outer layer with a step formed as an integral part of the coil facilitating attachment to the support structure, and fixing means contained within boundaries of the coil cooperating with the step for attaching the first and second annular coils to the support structure, said fixing means and said support structure axially extending no further than the annular winding.

2. A short superconducting annular MRI electro-magnet as claimed in claim 1, made by a process comprising the step of fabricating each of the annular coils as a formerless unit by impregnation of turns of the coils with a suitable impregnant.

3. A short superconducting annular MRI electro-magnet as claimed in claim 2, wherein the impregnant is an epoxy resin.

4. A short superconducting annular MRI electro-magnet as claimed in claim 1, made by a process comprising the steps of winding each of the coils on a mandrel enclosed in a mould in which the step is formed and impregnating each of the coils with an impregnant which is cured before the coil is removed from the mould and mandrel.

5. A short superconducting annular MRI electro-magnet as claimed in claim 4, wherein the process further comprises filling an annular space between the coil and the mould with a suitable filler prior to impregnation so that the step is formed in impregnated filler.

6. A short superconducting annular MRI electro-magnet as claimed in claim 5, wherein the filler comprises glass beads or fibre.

7. A short superconducting annular MRI electro-magnet as claimed in claim 1, and further comprising at least one clamp which engages each step to clamp the first annular coil and the second annular coil to the support structure.

8. A short superconducting annular MRI electro-magnet as claimed in claim 7, wherein the at least one clamp has a general L-shape, is bolted at one end thereof to the support structure, and is arranged at the other end thereof remote from the support structure to engage the step.

9. A short superconducting annular MRI electro-magnet as claimed in claim 1, and further comprising a plurality of equi-angularly spaced clamps engaging each step to clamp the first annular coil and the second annular coil to the support structure.

10. A short superconducting annular MRI electro-magnet as claimed in claim 1, wherein each of the coils is disposed symmetrically along a common longitudinal axis and each of the first and second annular coils is formed with a chamfer to facilitate the provision of flaring at each end of the cylindrical bore.

11. A short superconducting annular MRI electro-magnet as claimed in claim 10, and further comprising a vessel filled with liquid helium in which the winding is contained, a vacuum chamber within which the vessel is contained, and at least one heat shield positioned in the chamber between the vessel and an outer wall of the chamber.

12. MRI apparatus including a short superconducting annular MRI electro-magnet as claimed in claim 1, and including gradient coils and RF coils as required for imaging.

* * * * *